United States Patent
Choi et al.

(10) Patent No.: US 7,974,116 B2
(45) Date of Patent: Jul. 5, 2011

(54) VARIABLE RESISTANCE MEMORY DEVICE

(75) Inventors: Byung-gil Choi, Yongin-si (KR); Kwang-ho Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 374 days.

(21) Appl. No.: 12/314,965

(22) Filed: Dec. 19, 2008

(65) Prior Publication Data
US 2009/0251953 A1 Oct. 8, 2009

(30) Foreign Application Priority Data

Apr. 3, 2008 (KR) .................. 10-2008-0031371

(51) Int. Cl.
*G11C 11/00* (2006.01)
(52) U.S. Cl. .................. 365/148; 365/100; 365/189.011
(58) Field of Classification Search .................. 365/148, 365/100, 189.011
See application file for complete search history.

(56) References Cited

U.S. PATENT DOCUMENTS 7,808,815 B2 * 10/2010 Ro et al. ................. 365/163

FOREIGN PATENT DOCUMENTS

| KR | 10-0597636 | 6/2006 |
| KR | 10-0674992 | 1/2007 |
| KR | 10-0674997 | 1/2007 |

OTHER PUBLICATIONS

Abstract of KR 10-2005-0116569 published Dec. 13, 2005.

* cited by examiner

*Primary Examiner* — Son Dinh
*Assistant Examiner* — Nam T Nguyen
(74) *Attorney, Agent, or Firm* — Harness, Dickey & Pierce, P.L.C.

(57) ABSTRACT

A variable resistance memory device includes a variable resistance memory cell array including a plurality of variable resistance memory cells; a plurality of global word lines configured to drive the variable resistance memory cell array; and a plurality of local word line decoders. Each of the plurality of local word line decoders includes a first transistor having a gate connected to the global word line. A voltage greater than an operation voltage of one or more of the plurality of local word line decoders is applied to a selected one of the plurality of global word lines.

20 Claims, 5 Drawing Sheets

VARIABLE RESISTANCE MEMORY DEVICE

PRIORITY STATEMENT

This application claims priority under 35 U.S.C. §119 to Korean Patent Application No. 10-2008-0031371, filed on Apr. 3, 2008 in the Korean Intellectual Property Office, the entire contents of which is incorporated herein by reference.

BACKGROUND

Description of the Related Art

A conventional phase-change random access memory (PRAM) is a non-volatile memory, which stores data using a phase change material such as germanium-antimony-tellurium (Ge—Sb—Te, also known as GST). The phase of conventional phase change materials (such as GST) changes in response to changes in temperature and the resistance of the phase change materials changes according to the phase change. Since PRAM has all the advantages of a DRAM in addition to lower power consumption, PRAM is considered to be the next-generation memory.

SUMMARY

Example embodiments relate to variable resistance memory devices, for example, variable resistance memory devices capable of increasing the level of a voltage applied to a selected global word line.

At least one example embodiment provides a variable resistance memory device. The variable resistance memory device may include: a variable resistance memory cell array including a plurality of variable resistance memory cells; a plurality of global word lines configured to drive the variable resistance memory cell array; and a plurality of local word line decoders. Each of the plurality of local word line decoders may include a first transistor having a gate connected to one of the plurality of global word lines. A voltage greater than an operation voltage of one or more of the plurality of local word line decoders may be applied to a selected one of the plurality of global word lines.

According to at least some example embodiments, the voltage applied to the selected one of the plurality of global word lines may be a voltage that is greater than a threshold voltage of the first transistor. The voltage may be applied between a gate and a source of the first transistor connected to the selected global word line.

The variable resistance memory device may further include a plurality of local word lines. Each of the plurality of local word lines may correspond to one of the plurality of global word lines. A voltage that is greater than the sum of a threshold voltage of the first transistor and a threshold voltage of the variable resistance memory cells may be applied between a gate and a source of the first transistor connected to the selected global word line, and a voltage that is greater than the threshold voltage of the first transistor may be applied between a gate and a source of the first transistor connected to the unselected global word line.

Each of the plurality of local word line decoders may include a first transistor having a gate connected to a corresponding one of the plurality of global word lines and a first terminal connected to a corresponding one of the plurality of local word lines. A voltage that is applied to the selected global word line may be greater than a sum of the operation voltage of the local word line decoder and the threshold voltage of the first transistor.

According to at least one example embodiment, a variable resistance memory device may include: a variable resistance memory cell array including a plurality of variable resistance memory cells; a plurality of global word lines configured to drive the variable resistance memory cell array; and a plurality of local word lines. Each of the plurality of local word lines may correspond to one of the plurality of global word lines. The variable resistance memory device may further include a plurality of local word line decoders. Each of the plurality of local word line decoders may include a first MOS transistor, which has a gate connected to a corresponding one of the plurality of global word lines and a first terminal connected to a corresponding one of the plurality of local word lines. In a read mode in which data written to a portion of the variable resistance memory cells is read out, a voltage greater than the sum of a threshold voltage of the first MOS transistor and a threshold voltage of the variable resistance memory cells may be applied to a global word line connected to the variable resistance memory cell that is to be read.

According to at least some example embodiments, the variable resistance memory cells may be diode type phase-change memory cells. The threshold voltage of the variable resistance memory cells may be a threshold voltage of the diode type phase-change random access memory cells. The variable resistance memory cells may be various variable resistance memory cells such as phase-change random access memory (PRAM) cells, magnetic random access memory (MRAM) cells, ferroelectric random access memory (FRAM) cells, or the like.

A voltage that is greater than the sum of a threshold voltage and a power voltage of the first MOS transistor (Vtn+Vcc) may be applied to the global word line connected to the variable resistance memory cell that is to be read.

According to at least some example embodiments, each of the plurality of local word line decoders may further include a second MOS transistor. The second MOS transistor may have a gate connected to a corresponding global word line and a first terminal connected to a corresponding local word line. Alternatively, one or more of the plurality of local word line decoders may further include a second MOS transistor, whereas other ones of the plurality of local word line decoders may not. The second MOS transistor may have a gate connected to a corresponding global word line and a first terminal connected to a corresponding local word line.

According to at least some example embodiments, the first MOS transistor may be an NMOS transistor, and the second MOS transistor may be a PMOS transistor.

According to at least some example embodiments, operation voltage of a local word line decoder may refer to, for example, a threshold voltage of a first transistor included in the local word line decoder, a threshold voltage of the variable resistance memory cell, a power voltage of the variable resistance memory cell, etc.

BRIEF DESCRIPTION OF THE DRAWINGS

Example embodiments will become more apparent by describing in detail the attached drawings in which.

DETAILED DESCRIPTION OF EXAMPLE EMBODIMENTS

Figure 1:
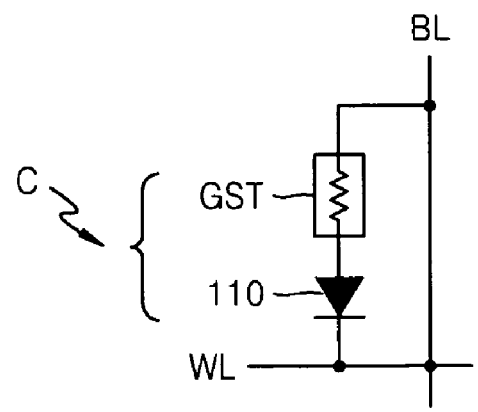
FIG. 1 is a circuit diagram of a phase-change random access memory (PRAM) cell according to an example embodiment.

Various example embodiments will now be described more fully with reference to the accompanying drawings in which some example embodiments of the invention are shown. In the drawings, the thicknesses of layers and regions are exaggerated for clarity.

Detailed illustrative embodiments are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the present invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

Further, it will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

Further still, it will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

The present invention will now be described more fully with reference to the accompanying drawings, in which exemplary embodiments of the invention are shown. Like reference numerals in the drawings denote like elements.

FIG. 1 is a circuit diagram of a phase-change random access memory (PRAM) cell according to an example embodiment. The PRAM shown in FIG. 1 is an example of a variable resistance memory cell.

As noted above, a PRAM is a non-volatile memory device that stores data using a phase-change material such as Ge—Sb—Te. Resistance of the phase-change material changes according to a change in phase, which changes in response to a temperature change. Although example embodiments are described herein with respect to GST, any suitable phase-change material may be used. Suitable phase change materials include, for example: arsenic-antimony-tellurium (As—Sb—Te), tin-antimony-tellurium (Sn—Sb—Te), tin-indium-antimony-tellurium (Sn—In—Sb—Te), arsenic-germanium-antimony-tellurium (As—Ge—Sb—Te), etc.

Other suitable phase change materials include: an element in Group VA-antimony-tellurium such as tantalum-antimony-tellurium (Ta—Sb—Te), niobium-antimony-tellurium (Nb—Sb—Te) or vanadium-antimony-tellurium (V—Sb—Te) or an element in Group VA-antimony-selenium such as tantalum-antimony-selenium (Ta—Sb—Se), niobium-antimony-selenium (Nb—Sb—Se) or vanadium-antimony-selenium (V—Sb—Se).

Still further, other suitable phase change materials include: an element in Group VIA-antimony-tellurium such as tungsten-antimony-tellurium (W—Sb—Te), molybdenum-antimony-tellurium (Mo—Sb—Te), or chrome-antimony-tellurium (Cr—Sb—Te) or an element in Group VIA-antimony-selenium such as tungsten-antimony-selenium (W—Sb—Se), molybdenum-antimony-selenium (Mo—Sb—Se) or chrome-antimony-selenium (Cr—Sb—Se).

Although phase change materials are described herein as being formed primarily of ternary phase-change chalcogenide alloys, the chalcogenide alloy of the phase change material could be selected from a binary phase-change chalcogenide alloy or a quaternary phase-change chalcogenide alloy. Example binary phase-change chalcogenide alloys may include one or more of Ga—Sb, In—Sb, In—Se, $Sb_2$—$Te_3$ or Ge—Te alloys; example quaternary phase-change chalcogenide alloys may include one or more of an Ag—In—Sb—Te, (Ge—Sn)—Sb—Te, Ge—Sb—(Se—Te) or $Te_{81}$—$Ge_{15}$—$Sb_2$—$S_2$ alloy, for example.

In other example embodiments, the phase change material may be composed of a transition metal oxide having multiple resistance states. For example, the phase change material may be composed of at least one material selected from the group consisting of NiO, $TiO_2$, HfO, $Nb_2O_5$, ZnO, $WO_3$, and CoO or GST ($Ge_2Sb_2Te_5$) or PCMO ($Pr_xCa_{1-x}MnO_3$). The phase change materials may be a chemical compound including one or more elements selected from the group consisting of S, Se, Te, As, Sb, Ge, Sn, In and Ag.

Returning to FIG. 1, the PRAM cell C includes a P-N junction diode 110 and a phase-change material (GST). The phase change material GST connects a bit line BL to a P-junction of the diode 110. A word line WL is connected to an N-junction of the diode 110. The phase change material GST of the PRAM cell stores data by switching the phase change material GST between two states, crystalline and amorphous, according to temperature and heating time. To change the phase of the GST, a relatively high temperature of greater than or equal to 900° C. may be required. This temperature may be obtained by Joule heating using a current flowing through the PRAM cell.

An example writing operation will now be described. When the phase change material GST is heated to greater than or equal to its melting temperature by an applied current, and then cooled rapidly (e.g., abruptly), the phase change material GST is in an amorphous state. In an amorphous state, the phase change material stores data "1." This state is referred to as a reset state.

When the GST is heated to greater than or equal to a crystallization temperature, maintained in this state for given period of time, and then cooled, the phase change material GST is in a crystallization state. In the crystallization state, the phase change material GST stores data "0". This state is referred to as a set state. Although example embodiments are discussed herein with respect to '1' corresponding to an amorphous state, and '0' corresponding to a crystalline state, these representations are interchangeable.

In an example reading operation, a bit line BL and a word line WL may be selected to select the PRAM cell C. A current may be applied from an external source (e.g., outside or external to the PRAM cell C) and data "1" is distinguished from data "0" based on the difference of the voltage change according to the resistance of the phase change material GST.

Figure 2:
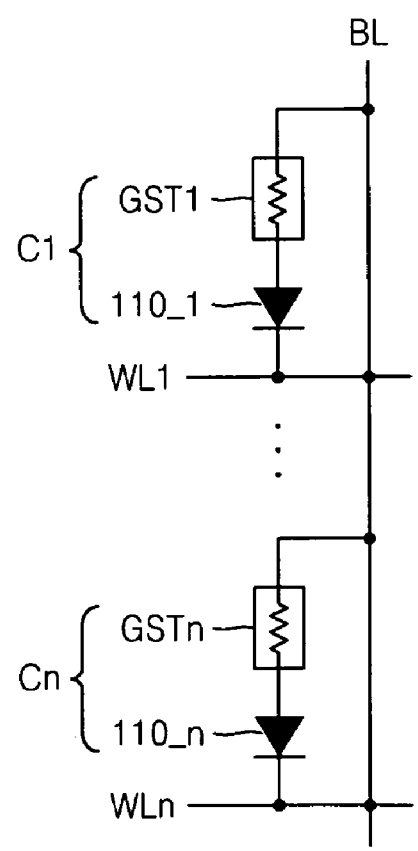
FIG. 2 is a circuit diagram of a portion of an example embodiment of a variable resistance memory cell array including a plurality of the phase-change memory cells of FIG. 1.

FIG. 2 is a circuit diagram of a portion of an example embodiment of a variable resistance memory cell array including PRAM cells of FIG. 1.

Referring to FIG. 2, a plurality of the variable resistance memory cells C1-Cn may be connected to the same bit line BL, but different word lines WL1-WLn. As described with reference to FIG. 1, the variable resistance memory cells C1-Cn may include phase change materials GST1-GSTn and diodes 110_1-110_n, respectively.

In FIG. 2, one bit line BL and a plurality of (e.g., n) word lines WL1-WLn are illustrated. However, one of ordinary skill in the art understands that the number of bit lines BL and the word lines WL1-WLn is not limited to the number shown in FIG. 2.

Figure 3:
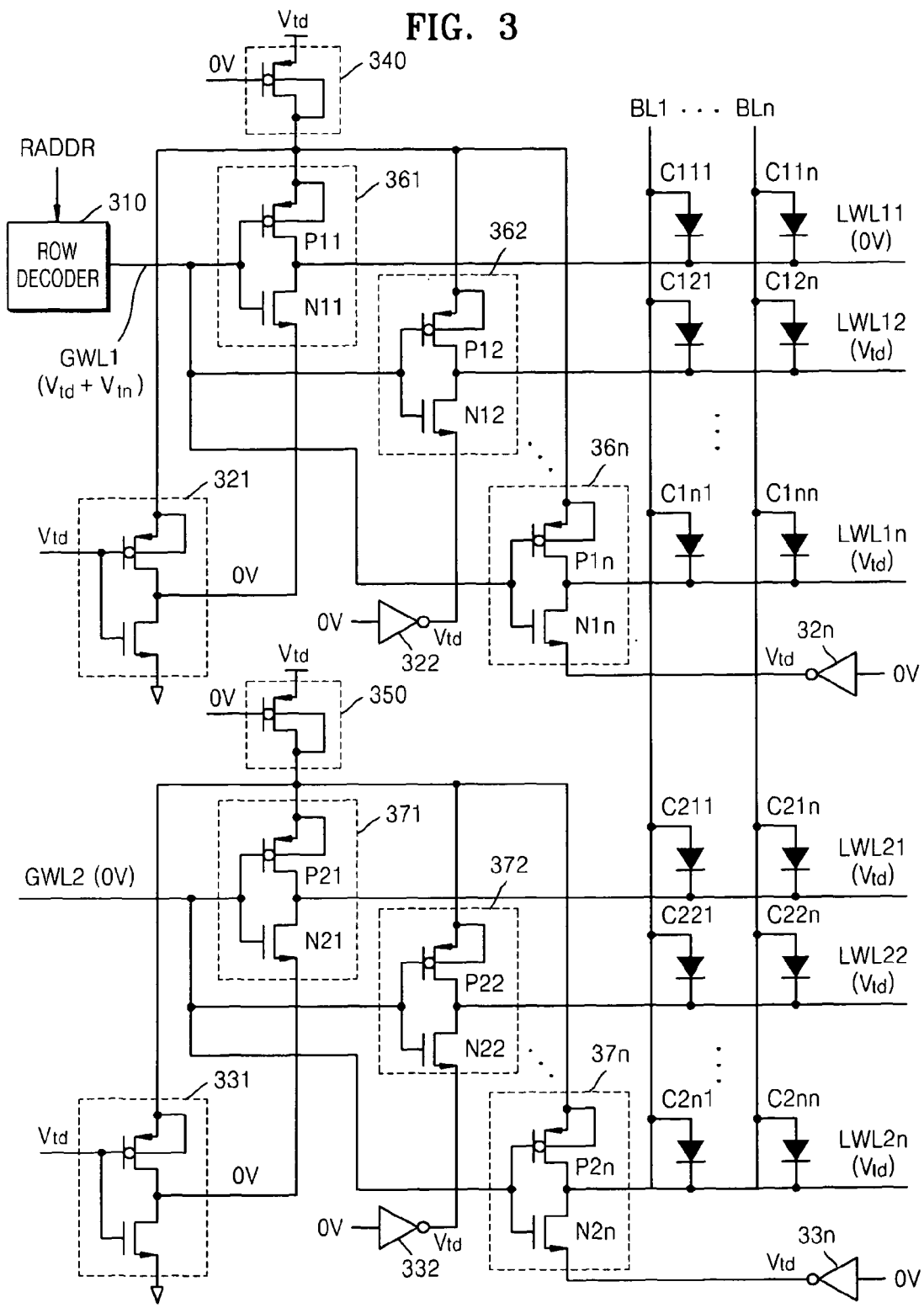
FIG. 3 is a circuit diagram of a variable resistance memory device according to an example embodiment.

FIG. 3 is a circuit diagram of a variable resistance memory device according to an example embodiment.

Referring to FIG. 3, the variable resistance memory device includes a plurality of variable resistance memory cell arrays C111-C2nn, a plurality of global word lines GWL1, GWL2, a plurality of local word lines LWL11-LWL1n, LWL21-LWL2n, and a plurality of local word line decoders 361-36n, 371-37n.

Each of the variable resistance memory cell arrays C111-C2nn includes a plurality of variable resistance memory cells C111-C2nn. The variable resistance memory cells C111-C2nn may be PRAM cells shown in FIGS. 1 and 2. In FIG. 3, the PRAM cell is shown as including a diode. However, the variable resistance memory cells C111-C2nn included in the variable resistance memory device according to at least this example embodiment may be other types of variable resistance memory cells. For example, the variable resistance memory cells C111-C2 nn may be various variable resistance memory cells such as magnetic random access memory (MRAM) cells, ferroelectric random access memory (FRAM) cells, or the like.

The global word lines GWL1, GWL2 and the local word lines LWL11-LWL1 n, LWL21-LWL2n drive the variable resistance memory cell arrays C111-C2 nn. Each of the plurality of local word lines LWL11-LWL1n and LWL21-LWL2 n correspond to one of the global word lines GWL1 and GWL2. For example, each of the local word lines LWL11-LWL1n correspond to the global word line GWL1, and each of the local word lines LWL21-LWL2n correspond to the global word line GWL2.

In an example reading operation, a global word line GWL1 is selected, and a of the local word lines LWL11-LWL1n corresponding thereto are also selected. Accordingly, data written to the variable resistance memory cell C111-C11n connected to the selected global word line GWL1 and the selected local word line LWL11 may be read.

The local word line decoders 361-36n, 371-37n are connected to corresponding ones of the local word lines LWL11-LWL1n, LWL21-LWL2n. The local word line decoders 361-36n, 371-37n may select individual ones of the local word lines LWL11-LWL1n, LWL21-LWL2n. For example, each of the local word line decoders 361-36n, 371-37n may select a corresponding (connected) local word lines LWL11-LWL1n, LWL21-LWL2n by applying a given, desired or predetermined voltage thereto.

Each of the plurality of local word line decoders 361-36n, 371-37n includes one of the plurality of first MOS transistors N11-N1n, N21-N2n. A gate of the first MOS transistors N11-N1n, N21-N2n may be connected to a corresponding one of the global word lines GWL1 and GWL2, and a first terminal of the first MOS transistors N11-N1n, N21-N2n may be connected to a corresponding local word line LWL11-LWL1n, LWL21-LWL2n. In one example, the first terminal refers to a drain of the first MOS transistors N11-N1n, N21-N2n.

In the variable resistance memory device according to at least this example embodiment, a voltage greater than the sum (Vtn+Vtd) of a threshold voltage Vtn of the first MOS transistor N11-N1n and a threshold voltage Vtd of the variable resistance memory cell C111-C11n may be applied to the selected global word line GWL1. When about 0 V or the threshold voltage Vtd of the variable resistance memory cell C111-C1nn is applied to a second terminal (e.g., source) of the first MOS transistor N11-N1n, a voltage greater than the threshold voltage Vtn of the first MOS transistor N11-N1n may be applied between a gate and the second terminal (e.g., source) of the first MOS transistor N11-N1n. Accordingly, the first MOS transistor N11-N1n turns on, and the voltage applied to the second terminal of the first MOS transistor N11-N1n transfers to the local word line LWL11-LWL1 n connected to the first terminal of the first MOS transistor N11-N1n with relatively little or no decrease in voltage.

A voltage greater than or equal to the sum (Vtn+Vtd) of the threshold voltage Vtn of the first MOS transistor N11-N1n and the threshold voltage Vtd of the variable resistance memory cell C111-C11n may be applied to the selected global word line GWL1.

In one example, to select the local word line LWL11, a voltage of about 0 V may be applied to the second terminal of the first MOS transistor N11 connected to the selected local word line LWL11, and the threshold voltage Vtd of the variable resistance memory cell C111-C1nn may be applied to the second terminal of the first MOS transistor N12-N1n connected to the unselected local word line LWL12-LWL1 n. If a voltage that is greater than or equal to the sum Vtn+Vtd is applied to the gate of the first MOS transistor N11-N1n, the first MOS transistor N11-N1n turns on, and thus about 0 V is transferred to the selected local word line LWL11, and the threshold voltage Vtd of the variable resistance memory cell transfers to the unselected local word lines LWL12-LWL1n.

Figure 4:
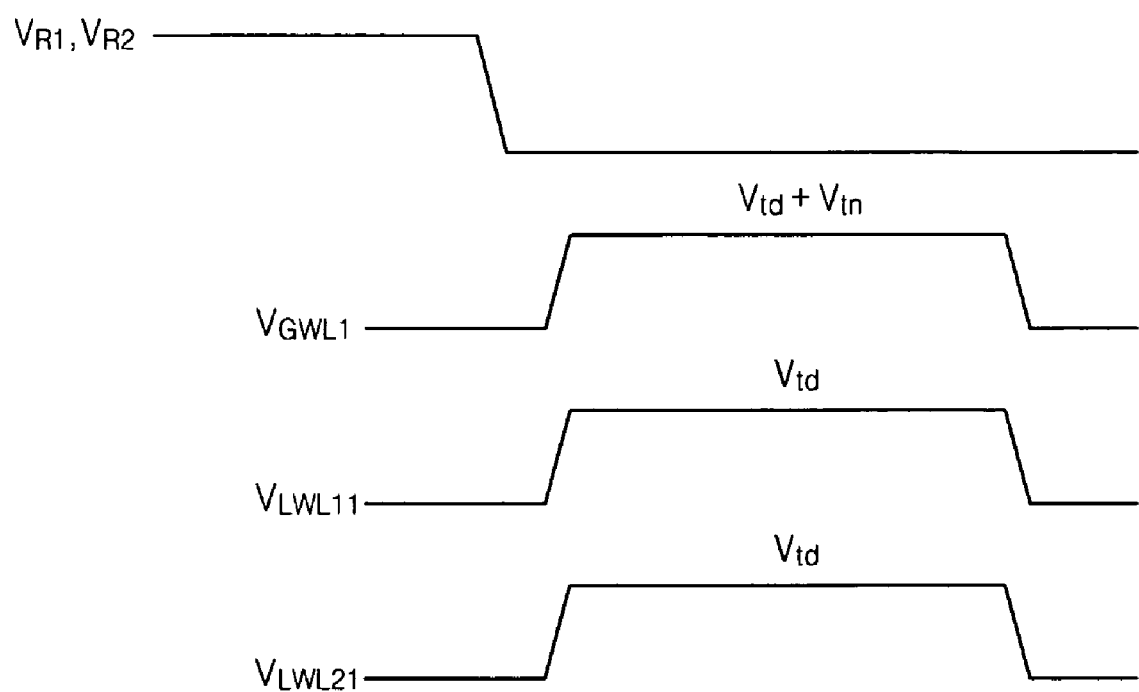
FIG. 4 is a timing diagram for explaining example operation of the example embodiment of the variable resistance memory device shown in FIG. 3.

FIG. 4 illustrates the threshold voltage Vtd of the variable resistance memory cell applied to the selected local word line LWL11. Voltages VR1 and VR2 of FIG. 4 refer to voltages applied to voltage transfer circuits 340 and 350 of FIG. 3. The voltage transfer circuits 340 and 350 of FIG. 3 will be described later.

In an example reading operation of the variable resistance memory cells C111-C11n, about 0 V may be applied to the selected local word line LWL11, whereas the threshold voltage may be applied to the unselected local word lines LWL12-LWL1n. In this case, data written to the variable resistance memory cells C111-C11n may be read, whereas data written to the variable resistance memory cells C121-C11n may not.

As described above, in variable resistance memory devices according to example embodiments, a voltage applied to the unselected local word lines LWL12-LWL1 n of the selected global word line GWL1 may be the threshold voltage Vtd of the variable resistance memory cell C111-C1nn, and thus data of the variable resistance memory cell C111-C1nn may be read normally. For example, if the variable resistance memory cell C111-C1nn is a diode type PRAM cell, the threshold voltage of the variable resistance memory cells C111-C1nn may be the threshold voltage of the diode type variable resistance memory cell. In this example, a normal reading operation may be performed by applying about 0 V to the diode type variable resistance memory cell C111-C11n and applying the threshold voltage to the unselected diode type variable resistance memory cells C121-C1nn.

A voltage of about 0 V may also be applied to the unselected global word line GWL2. In this example, the first MOS transistors N21-N2n turns off, and the threshold voltage Vtd of the variable resistance memory cells C211-C2nn may be applied to the local word lines LWL21-LWL2n. Accordingly, the threshold voltage Vtd of the variable resistance memory cells C211-C2nn may also be applied to the local word lines.

As described above, in variable resistance memory devices according to example embodiments, the voltage applied to the unselected local word lines LWL12-LWL1 n corresponding to the selected global word line GWL1 have the same or substantially the same voltage level as the voltage applied to the local word lines LWL21-LWL2n connected to the unselected global word line GWL2.

Referring back to FIG. 3, each of the local word line decoders 361-36n, 371-37 n may further include a second MOS transistor P11-P1n, P21-P2n. A gate of the second MOS transistor P11-P1n, P21-P2n may be connected to a corresponding global word line GWL1, GWL2, and a first terminal of the second MOS transistor P11-P1n, P21-P2n may be connected to the local word line LWL11-LWL1n, LWL21-LWL2n. The threshold voltage Vtd of the variable resistance memory cell may be supplied to the second terminal of the second MOS transistor P11-P1n, P21-P2n.

When about 0 V is applied to the unselected global word line GWL2, the second MOS transistor P21-P2n turns on and the threshold voltage Vtd of the variable resistance memory cell applied to the second terminal of the second MOS transistors P11-P1n, P21-P2n transfers to the local word lines LWL21-LWL2n.

In at least this example embodiment, the first MOS transistors N11-N1n, N21-N2n are NMOS transistors, and the second MOS transistors P11-P1n, P21-P2 n are PMOS transistors. However, other transistors may also be used by one of ordinary skill in the art.

Still referring to FIG. 3, variable resistance memory devices according to at least this example embodiment may further include a row decoder 310, bias circuits 321-32n, 331-33n, and voltage transfer circuits 340 and 350.

The row decoder 310 may decode row address RADDR and apply given, desired or predetermined voltages to the global word lines GWL1 and GWL2 according to the selection of the global word lines GWL1 and GWL2. For example, a voltage greater than or equal to the sum (Vtn+Vtd) of the threshold voltage Vtn of the first MOS transistor and the threshold voltage Vtd of the variable resistance memory cell may be applied to the selected global word line GWL1, while about 0 V may be applied to the unselected global word line GWL2.

Each of the bias circuits 321-32n, 331-33n is connected to a corresponding local word line decoder 361-36n, 371-37n. Each of the bias circuits 321-32n, 331-33n may apply a given, desired or predetermined voltage to the first transistor N11-N1n, N21-N2n of the corresponding local word line decoders 361-36n, 371-37n. For example, about 0 V may be applied to the first MOS transistor N11 connected to the selected local word line LWL11, and the threshold voltage Vtd of the variable resistance memory cell may be applied to the first MOS transistor N12-N1n connected to the unselected local word line LWL12-LWL1 n. Each of the bias circuits 321-32n, 331-33n may buffer, reverse (invert) and apply an input voltage to the first MOS transistor N11-N1n. To this end, each of the bias circuits 321-32n, 331-33n may include a PMOS transistor and an NMOS transistor connected in series.

The voltage transfer circuits 340 and 350 may supply the threshold voltage Vtd of the variable resistance memory cell to the second MOS transistor P11-P1n, P21-P2n of the local word line decoder 361-36n, 371-37n. To this end, the voltage transfer circuits 340 and 350 may include a PMOS transistor, a first terminal of which may be connected to the threshold voltage Vtd of the variable resistance memory cell, and a second terminal of which may be connected to the second terminal of the second MOS transistor P11-P1n, P21-P2n.

In this example embodiment, a threshold voltage Vtd of the variable resistance memory cell may be used in variable resistance memory devices according to at least this example embodiment. However, a voltage having other voltage level may also be used.

For example, a power voltage Vcc that is greater than the threshold voltage Vtd of the variable resistance memory cell may be used. In this case, a voltage that is greater than the sum (Vtn+Vcc) of the threshold voltage Vtn and the power voltage Vcc of the first MOS transistor may be applied to the selected global word line GWL1. The power voltage Vcc may also be applied to the second end of the first MOS transistor N12-N1n connected to the unselected local word line LWL12-LWL1 n. If a voltage greater than the threshold voltage Vtn of the first MOS transistor is applied between a gate and a source of the first MOS transistor N11-N1 n, the first MOS transistor N11-N1n turns on, and the power voltage Vcc applied to the second terminal of the first MOS transistor N11-N1n is transferred to the local word line LWL12-LWL1n with relatively little or no decrease in voltage. Because the power voltage Vcc is greater than the threshold voltage Vtd of the variable resistance memory cell, data stored in the variable resistance memory cell C111-C1nn is read normally.

Figure 5:
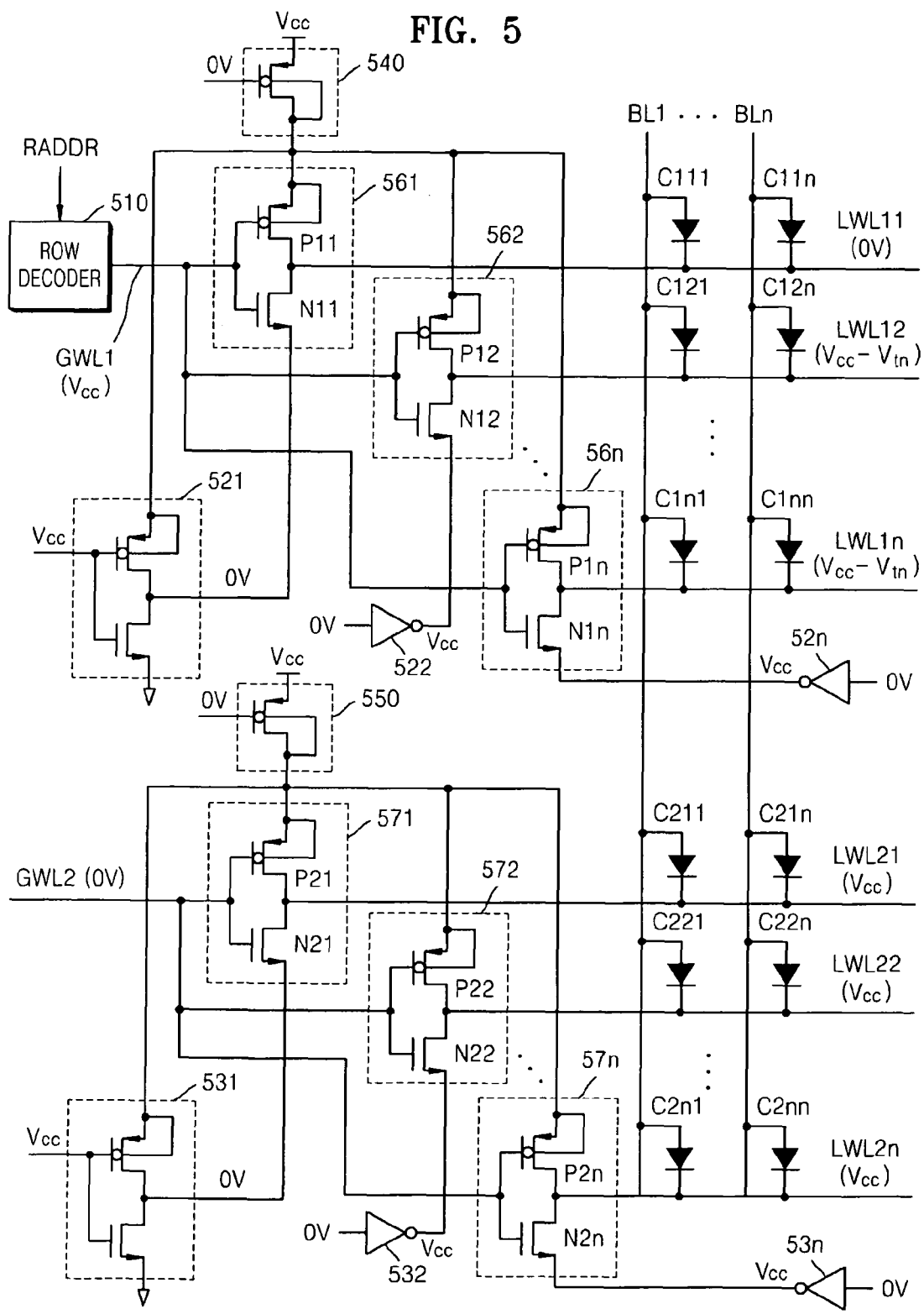
FIG. 5 is a circuit diagram showing a variable resistance memory device according to a first comparison example for comparison with the variable resistance memory device according to example embodiments.

FIG. 5 is a circuit diagram of a variable resistance memory device according to a first comparison example for comparison with the variable resistance memory device according to example embodiments.

In this example, the description of the variable resistance memory device according to the first comparison example of FIG. 5 will focus on the differences from example embodiments.

Referring to FIG. 5, in the variable resistance memory device according to the first comparison example, a power voltage Vcc is applied to a selected word line GWL1, and a power voltage Vcc is also applied to a second terminal of the first MOS transistor N12-N1n connected to the local word line LWL12-LWL1n. In this case, the first MOS transistor N12-N1n may not turn on completely, which causes a voltage decrease in the amount of the threshold voltage Vtn of the first MOS transistor N12-N1n. As a result, the power voltage Vcc applied to the second terminal of the first MOS transistor N12-N1n decreases as much as the threshold voltage Vtn of the first MOS transistor N12-N1n, and is transferred to the local word line LWL12-LWL1n. Thus, if the voltage transferred to the unselected local word line LWL12-LWL1n is lower than the threshold voltage Vtd of the variable resistance memory cell, a current also flows through the unselected variable resistance memory cell C121-C1nn, and thus a normal reading operation may not be performed properly.

Figure 6:
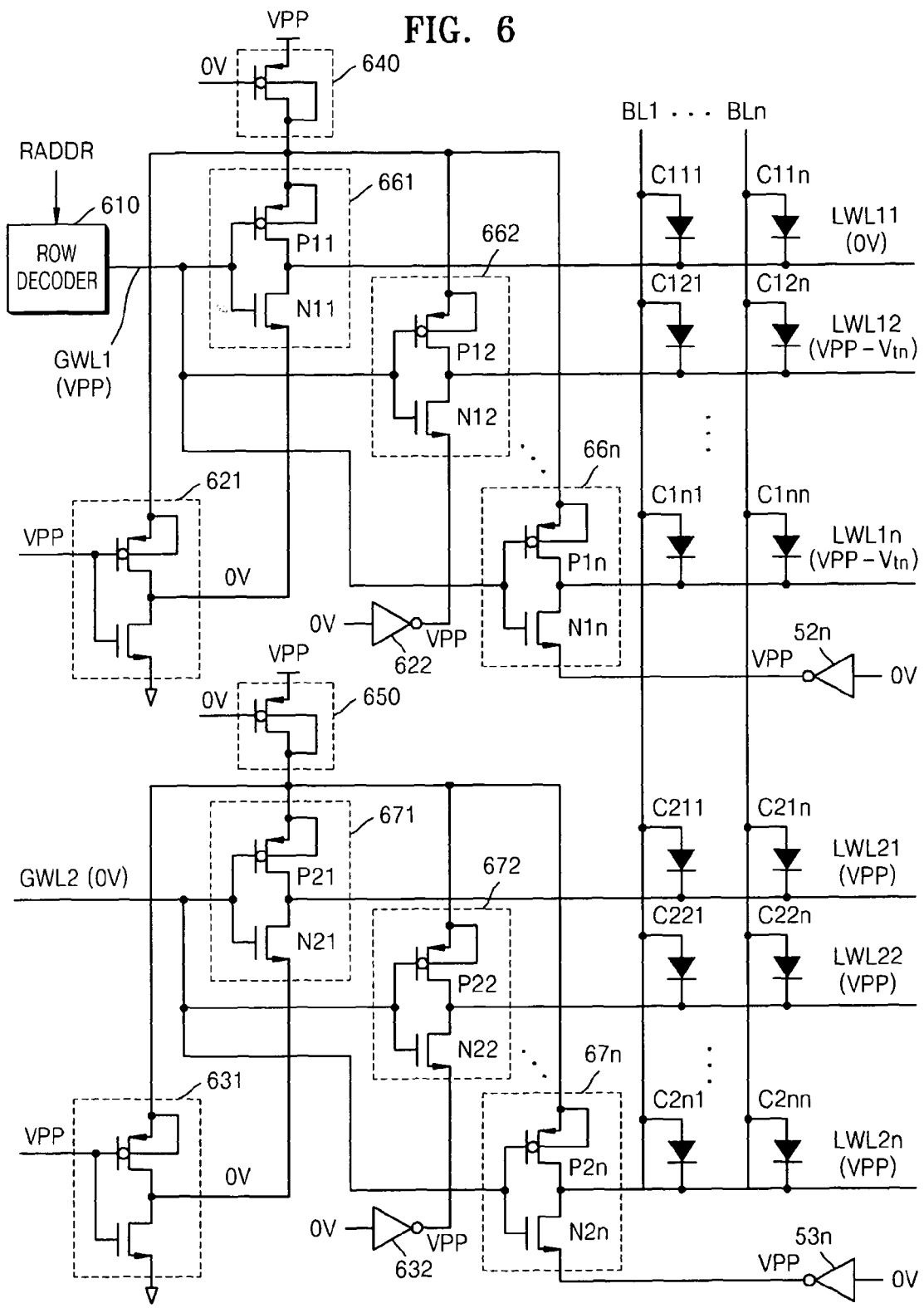
FIG. 6 is a circuit diagram showing a variable resistance memory device according to a second comparison example for comparison with the variable resistance memory device according to example embodiments.

FIG. 6 is a circuit diagram of a variable resistance memory device according to a second comparison example for comparison with the variable resistance memory device according to example embodiments.

The description of the circuit diagram of a variable resistance memory device according to the second comparison example will focus on the differences from the example embodiments described herein.

Referring to FIG. 6, in the variable resistance memory device according to the second comparison example, a voltage Vpp is applied to the selected word line GWL1 and a second terminal of the first MOS transistor N11-N1n. In this case, the voltage Vpp applied to the second terminal of the first MOS transistor N11-N1n decreases as much as the threshold voltage Vtn of the first MOS transistor N11-N1 n and transfers to the local word line LWL12-LWL1n, thereby increasing a standby current.

In the example embodiment shown in FIG. 3, all local word line decoders 361-36 n, 371-37n are illustrated as including first MOS transistors N11-N1n, N21-N2 n and second MOS transistors P11-P1n, P21-P2n. However, according to example embodiments, only at least one of the local word line decoders 361-36n, 371-37n, for example, the local word line decoder 361, need include a second transistor P11. In this alternative example, the rest of the local word line decoders 362-36n may not include a second MOS transistor. The second MOS transistor P11 may be shared by other local word line decoders 362-36n.

For example, only the local word line decoder 361 may include a second MOS transistor, and other local word line decoders 362-36n may not include a second MOS transistor. In this case, the first MOS transistors of the other local word line decoders 362-36n may be connected to the second MOS transistor of the local word line decoder 361.

In variable resistance memory devices according to example embodiments, a read margin may be ensured by increasing the voltage level of a voltage applied to the selected global word line.

While example embodiments have been particularly shown and described with reference to the example embodiments shown in the drawings, these example embodiments should be considered in descriptive sense only and not for purposes of limitation. It will be understood by those skilled in the art that various changes in form and details may be made therein without departing from the spirit and scope of the present invention as defined by the appended claims. Therefore, the scope of the present invention is defined not by the detailed description of the present invention but by the appended claims, and all differences within the scope thereof will be construed as being included in one or more embodiments of the present invention.

What is claimed is:

1. A variable resistance memory device comprising:
   a variable resistance memory cell array including a plurality of variable resistance memory cells;
   a plurality of global word lines configured to drive the variable resistance memory cell array; and
   a plurality of local word line decoders, each of the plurality of local word line decoders including a first transistor having a gate connected to one of the plurality of global word lines; wherein
   a voltage greater than an operation voltage of one or more of the plurality of local word line decoders is applied to a selected one of the plurality of global word lines.

2. The variable resistance memory device of claim 1, wherein the operation voltage is a threshold voltage of the first transistor, and the voltage applied to the selected global word line is greater than a sum of the threshold voltage and a power voltage of the first transistor.

3. The variable resistance memory device of claim 1, wherein the operation voltage is a threshold voltage of the first transistor, and the voltage applied to the selected global word line is equal to the sum of the threshold voltage and a threshold voltage of the variable resistance memory cells.

4. The variable resistance memory device of claim 1, further comprising:
   a plurality of local word lines, each of the plurality of local word lines being connected to a corresponding one of the plurality of global word lines; wherein
   a first terminal of the first transistor of each of the plurality of local word line decoders is connected to a corresponding one of the plurality of local word lines,
   the operation voltage is a threshold voltage of the first transistor, and
   in a read mode in which data written to at least a first of the plurality of variable resistance memory cells is read out, the voltage applied to the selected one of the plurality of global word lines is a voltage greater than the sum of the threshold voltage of the first transistor and a threshold voltage of the variable resistance memory cells, the selected one of the plurality of global word lines being connected to the first variable resistance memory cell to be read.

5. The variable resistance memory device of claim 4, wherein the variable resistance memory cells are diode type phase-change memory cells.

6. The variable resistance memory device of claim 4, wherein at least one of the plurality of local word line decoders further includes,
   a second transistor having a gate connected to a corresponding one of the plurality of global word lines and a first terminal connected to a corresponding one of the plurality of local word lines.

7. The variable resistance memory device of claim 6, wherein the first transistor is an NMOS transistor and the second transistor is a PMOS transistor.

8. The variable resistance memory device of claim 6, wherein one of the plurality of local word line decoders further includes the second transistor, but other ones of the plurality of local word line decoders do not include a second transistor.

9. The variable resistance memory device of claim 8, wherein the first transistor is an NMOS transistor, and the second transistor is a PMOS transistor.

10. The variable resistance memory device of claim 6, wherein each of the plurality of local word line decoders further includes,
   a second transistor having a gate connected to a corresponding one of the plurality of global word lines and a first terminal connected to a corresponding one of the plurality of local word lines.

11. The variable resistance memory device of claim 1, wherein the operation voltage is a threshold voltage of the first transistor, and the voltage is applied between a gate and a source of the first transistor connected to the selected global word line.

12. The variable resistance memory device of claim 11, further comprising:
   a plurality of local word lines, each of the plurality of local word lines corresponding to one of the plurality of global word lines; wherein
      the voltage applied between a gate and a source of the first transistor connected to the selected global word line is greater than the sum of the threshold voltage of the first transistor and a threshold voltage of the variable resistance memory cells, and
      a voltage that is greater than the threshold voltage of the first transistor is applied between a gate and a source of the first transistor connected to the unselected global word line.

13. The variable resistance memory device of claim 11, wherein the variable resistance memory cells are diode type phase-change random access memory cells, and a threshold voltage of the variable resistance memory cells is the threshold voltage of the diode-type phase-change random access memory cell.

14. The variable resistance memory device of claim 11, wherein a voltage greater than the sum of the threshold voltage and a power voltage of the first transistor is applied to the global word line connected to a variable resistance memory cell to be read.

15. The variable resistance memory device of claim 11, wherein a voltage equal to the sum of the threshold voltage of the first transistor and a threshold voltage of the variable resistance memory cells is applied to the global word line connected to a variable resistance memory cell to be read.

16. The variable resistance memory device of claim 11, wherein each of the plurality of local word line decoders further includes,
   a second transistor having a gate connected to the global word lines and a first terminal connected to the local word lines.

17. The variable resistance memory device of claim 11, wherein one of the plurality of word line decoders further includes,
   a second transistor having a gate connected to the global word lines and a first terminal connected to the local word lines, but other ones of the plurality of local word line decoders do not include a second transistor.

18. The variable resistance memory device of claim 1, further comprising:
   a plurality of local word lines, each of the plurality of local word lines corresponding to one of the plurality of global word lines; wherein
      a grounding voltage is applied to an unselected one of the plurality of global word lines.

19. The variable resistance memory device of claim 18, wherein each of the plurality of local word line decoders includes,
   a first transistor having a gate connected to a corresponding one of the plurality of global word lines and a first terminal connected to a corresponding one of the plurality of local word lines, and wherein
      the voltage that is applied to the selected global word line is greater than a sum of the operation voltage of the local word line decoder and a threshold voltage of the first transistor.

20. The variable resistance memory device of claim 18, wherein the operation voltage of the local word line decoder is a threshold voltage or a power voltage of the variable resistance memory cell.

* * * * *